United States Patent
Kojima et al.

(10) Patent No.: US 8,039,307 B2
(45) Date of Patent: Oct. 18, 2011

(54) MOUNTED BODY AND METHOD FOR MANUFACTURING THE SAME

(75) Inventors: Toshiyuki Kojima, Kyoto (JP); Seiichi Nakatani, Osaka (JP); Yoshihisa Yamashita, Kyoto (JP); Takashi Kitae, Osaka (JP); Shingo Komatsu, Osaka (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 12/728,615

(22) Filed: Mar. 22, 2010

(65) Prior Publication Data

US 2010/0224986 A1   Sep. 9, 2010

Related U.S. Application Data

(62) Division of application No. 11/911,144, filed as application No. PCT/JP2006/303037 on Feb. 21, 2006, now Pat. No. 7,713,787.

(51) Int. Cl.
*H01L 23/498* (2006.01)

(52) U.S. Cl. .......... 438/107; 438/119; 438/125

(58) Field of Classification Search .......... 438/119, 438/118, 125, 107
See application file for complete search history.

(56) References Cited

U.S. PATENT DOCUMENTS

| | | | | |
|---|---|---|---|---|
| 4,266,140 A | * | 5/1981 | Kaufman | 250/551 |
| 5,668,405 A | * | 9/1997 | Yamashita | 257/668 |
| 2007/0001313 A1 | * | 1/2007 | Fujimoto et al. | 257/778 |

FOREIGN PATENT DOCUMENTS

| | | |
|---|---|---|
| EP | 1 873 819 A1 | 1/2008 |
| JP | 3-012992 | 1/1991 |
| JP | 3-018041 | 1/1991 |
| JP | 4-286134 | 10/1992 |
| JP | 7-050353 | 2/1995 |
| JP | 8-088245 | 4/1996 |
| JP | 2000-036504 | 2/2000 |
| JP | 2004-260131 | 9/2004 |

* cited by examiner

*Primary Examiner* — Leonardo Andujar
(74) *Attorney, Agent, or Firm* — Hamre, Schumann Mueller & Larson P.C.

(57) ABSTRACT

A mounted body (100) of the present invention includes: a semiconductor element (10) having a surface (10a) on which element electrodes (12) are formed and a rear surface (10b) opposing the surface (10a); and a mounting board (30) on which wiring patterns (35) each having an electrode terminal (32) are formed. The rear surface (10b) of the semiconductor element (10) is in contact with the mounting board (30), and the element electrodes (12) of the semiconductor element (10) are connected electrically to the electrode terminals (32) of the wiring pattern (35) formed on the mounting board (30) via solder connectors (20) formed of solder particles assembled into a bridge shape. With this configuration, fine pitch connection between the element electrodes of the semiconductor element and the electrode terminals of the mounting board becomes possible.

19 Claims, 12 Drawing Sheets

MOUNTED BODY AND METHOD FOR MANUFACTURING THE SAME

This application is a division of U.S. Ser. No. 11/911,144, filed Oct. 10, 2007, which is a U.S. National Stage Application of PCT/JP2006/303037, filed Feb. 21, 2006, which applications are incorporated herein by reference.

TECHNICAL FIELD

The present invention relates generally to a mounted body and a method for manufacturing the same. In particular, the present invention relates to a mounted body in which a semiconductor element is mounted on a mounting board and a method for manufacturing the same.

BACKGROUND ART

Accompanying the miniaturization and performance enhancement of electronic equipment in recent years, the number of pins in a semiconductor element included in the electronic equipment increases and various types of electronic components constituting the electronic equipment become smaller. Accordingly, there has been a dramatic increase in the number and density of wirings in a printed board on which they are mounted. In particular, the number of leads led out from the semiconductor element (semiconductor chip) and the number of terminals have increased rapidly, so that the printed board (wiring board) becomes increasingly finer. Consequently, fine pitch connection techniques are gaining greater importance.

The fine pitch connection techniques can be divided broadly into a wire bonding (WB) method, a flip chip bonding (FC) method, and a tape automated bonding (TAB) method, each of which will be described briefly in the following.

According to the wire bonding (WB) method, electrodes of a semiconductor chip and electrodes of a lead frame are connected to each other mainly using gold wires (diameter: 20 to 25 (m). The connection is achieved through solid phase diffusion caused by applying heat or ultrasonic waves to the gold wires and the electrodes of both the semiconductor chip and the lead frame. The WB method is disclosed in Patent Document 1, for example. According to the flip chip bonding (FC) method, bumps (protruding electrodes) are formed on a semiconductor chip, and these bumps are connected to electrodes on a wiring board. The FC method is characterized in that it provides a configuration in which a surface on which the electrodes are formed (hereinafter, referred to simply as an "electrode-formed surface") of the semiconductor chip and an electrode-formed surface of the wiring board face each other. The FC method is disclosed in Patent Document 2, for example. According to the TAB method, semiconductor chips first are connected to a long tape provided with lead wirings. The chip provided with the lead then is punched out from the tape, and the lead is connected to a substrate. Basically, the TAB method is carried out automatically through a reel-to-reel process. The TAB method is disclosed in Patent Document 3, for example.

Patent Document 1: JP 4 (1992)-286134 A
    Patent Document 2: JP 2000-36504 A
    Patent Document 3: JP 8 (1996)-88245 A The WB method disclosed in Patent Document 1 will be described with reference to FIGS. 21A and 21B. FIG. 21A is a top view showing the wire-bonded state, and FIG. 21B is a cross-sectional view taken along a line I-I in FIG. 21A According to the WB method, a semiconductor chip 501 is die-bonded to a portion (a die pad) of a lead frame 504, and then wire bonding pads 502 of the semiconductor chip 501 and external terminals 505 (inner lead portions) of the lead frame 504 are wire-bonded using bonding wires 503. Thereafter, a region including the semiconductor chip 501 and the inner lead portions of the external terminals 505 is encapsulated with an encapsulation resin 506, whereby, for example, a resin-encapsulated body (a semiconductor module) 500 as shown in FIG. 22 is obtained. The external terminals 505 exposed from the encapsulation resin 506 are connected to a wiring board (not shown), whereby the semiconductor chip 501 is connected electrically to the wiring board.

However, the WB method has the following problems. First, there is a problem in that a mounting area of a semiconductor element component (here, this refers to the module 500 including the semiconductor chip 501) is large. That is, in the WB method, since the semiconductor chip 501 is not mounted on the wiring board directly but is connected to the external terminals 505 of the lead frame 504 via the bonding wires 503, it is inevitable that the size of the semiconductor module 500 (the element size or the component side) becomes larger than that of the semiconductor chip 501. Consequently, the mounting area of the semiconductor module 500 becomes large.

Furthermore, since the wire bonding pads 502 of the semiconductor chip 501 and the external terminals 505 of the lead frame 504 are connected to each other one by one with the bonding wires 503, there is a problem in that, as the number of the terminals increases, the time and effort required for the operation increase. Moreover, the pitch of the external terminals 505 on the lead frame 504 defines the pitch of the semiconductor element 500, thus imposing limitations on the narrowing of the pitch.

Next, the FC method disclosed in Patent Document 2 will be described with reference to FIG. 23. FIG. 23 shows a cross-sectional configuration of a semiconductor device 600 mounted by the FC method.

According to the FC method, electrodes 604 of a semiconductor chip 605 are connected to wiring patterns 602 provided on a substrate 601 via bumps 603. More specifically, the electrodes 604 of the semiconductor chip 605 that has a sensitive area 606 in which a transistor etc. are formed are connected to the predetermined wiring patterns 602 provided on the substrate 601 via the bumps 603, whereby the semiconductor chip 605 is mounted on the substrate 601 with a space being formed therebetween. Thereafter, an encapsulation resin 607 is formed by inserting resin into the space between the substrate 601 and the semiconductor chip 605 so as to embed the wiring patterns 602, the bumps 603, and the electrodes 604 in the resin. The semiconductor device 600 for which the FC method is employed is configured as above.

However, the FC method has the following problems. First, there is a problem in that aligning the semiconductor chip 605 is difficult. According to the FC method, since the semiconductor chip 605 is mounted on the substrate 601 with its electrode-formed surface facing downward, the bumps 603 of the semiconductor chip 605 cannot be seen directly from the outside. This makes the alignment very difficult. Moreover, the pitch of the electrodes 604 of the semiconductor chip 605 when the FC method is employed is narrower than the pitch of the external terminals 505 when the WB method is employed. This factor also makes the alignment difficult.

Also, there is a problem in that the substrate 601 is liable to be expensive. The reason for this is that, according to the FC method, the substrate 601 is required to have the wiring patterns 602 that are fine patterns corresponding to the pitch of the electrodes 604 of the semiconductor chip 605. Another reason is that, when the electrodes 604 of the semiconductor chip 605 are arranged in an area array form, the substrate 601 is liable to have a multilayer structure. Moreover, when the FC method is employed, the semiconductor chip 605 is connected to the substrate 601 via the bumps 603. Thus, unless the coefficient of linear expansion of the semiconductor chip 605 is made as close as possible to the coefficient of linear expansion of the substrate 601, a stress is applied to the bumps 603 etc. Therefore, it is necessary to match the coefficients of linear expansion of both the semiconductor chip 605 and the substrate 601, and the matching of the coefficients of linear expansion needs to be performed strictly. In this respect, the cost of the substrate 601 increases.

Moreover, since the semiconductor chip 605 is connected to the substrate 601 via the bumps 603, the heat dissipation is deteriorated. More specifically, since the semiconductor chip 605 is disposed on the substrate 601 with points thereof being in contact with the substrate 601 rather than the surface thereof being in contact with the substrate as in the case of the WB method, the heat dissipation is deteriorated. Also, in the first place, forming the bumps 603 takes time and effort.

Next, the TAB method disclosed in Patent Document 3 will be described with reference to FIGS. 24 and 25. FIG. 24 shows a cross-sectional configuration of a semiconductor device 700 for which the TAB method is employed, and FIG. 25 shows a configuration in which this semiconductor device 700 is mounted on a mounting board 709.

The semiconductor device 700 shown in FIG. 24 includes a base film 702 of a film carrier tape and a semiconductor IC chip 701 arranged in a device hole 702b provided in the base film 702. Copper foil wirings 703 are formed on the base film 702, and electrodes 701a of the semiconductor IC chip 701 are connected to inner leads 703a provided in inner end portions of the copper foil wirings 703. Lands 703b for external connection are provided at portions of the copper foil wirings 703 on the outer side relative to the inner leads 703a, and solder bumps 706 are formed on the lands 703b. Through holes 702a are provided in the base film 702. At the center of each of the lands 703b, a pore 703c is provided. A cover resist 704 is formed on the film carrier tape excluding the portions where the lands 703b are formed. An encapsulation resin 705 for protecting the semiconductor IC chip 701 is provided in the device hole 702b.

In this semiconductor device 700, the solder bumps 706 serve as outer leads, and as shown in FIG. 25, the solder bumps 706 are connected to pads 709a on the mounting board 709. The semiconductor device 700 for which the TAB method is employed is mounted on the mounting board 709 by a mass reflow process.

However, the TAB method has the following problems. First, since an inner lead bonding (ILB) step and an outer lead bonding (OLB) step are separate steps, it takes time and effort to perform the TAB method. More specifically, in the example shown in FIG. 24, the step of connecting the inner leads 703a to the electrodes 701a of the semiconductor IC chip 701 and the step of forming the solder bumps 706 at the lands 703b are different types of steps, which complicates the operation. Furthermore, it is also necessary to encapsulate the semiconductor IC chip 701 arranged in the device hole 702b with the encapsulation resin 705, which also takes time and effort. In addition, there is a different type of problem in that, because the base film 702 having a larger area than the semiconductor IC chip 701 is used, the mounting area increases.

DISCLOSURE OF INVENTION

The present invention has been made in light of the above-described problems. The present invention provides a mounted body for which a novel fine pitch connection technique that is different from the wire bonding (WB) method, the flip chip bonding (FC) method, and the tape automated bonding (TAB) method is employed and also provides a method for manufacturing the same.

A mounted body according to the present invention includes: a semiconductor element having a surface on which an element electrode is formed and a rear surface opposing said surface; and a mounting board on which a wiring pattern having an electrode terminal is formed. The rear surface of the semiconductor element is in contact with the mounting board, and the element electrode of the semiconductor element is connected electrically to the electrode terminal of the wiring pattern formed on the mounting board via a solder connector formed of solder particles assembled into a bridge shape.

A method for manufacturing a mounted body according to the present invention includes the steps of: (a) placing, on a mounting board on which a wiring pattern having an electrode terminal is formed, a semiconductor element having a surface on which an element electrode is formed and a rear surface opposing said surface such that the rear surface of the semiconductor element faces the mounting board; (b) applying a solder resin paste, obtained by mixing in a resin a solder powder and a convection additive that boils when the resin is heated, to a region including the element electrode and the electrode terminal; (c) arranging a substrate having a first surface on which an electrode pattern is formed and a second surface opposing the first surface such that the first surface of the substrate faces the surface of the semiconductor element and the mounting board with the solder resin paste intervening therebetween and that the electrode pattern of the substrate covers the element electrode and the electrode terminal; and (d) heating the solder resin paste so that the convection additive boils to cause convection in the resin, thus causing self-assembly of the solder powder contained in the solder resin paste to form a solder member that connects at least between the element electrode and the electrode pattern and between the electrode terminal and the electrode pattern.

DESCRIPTION OF THE INVENTION

Figure 1:
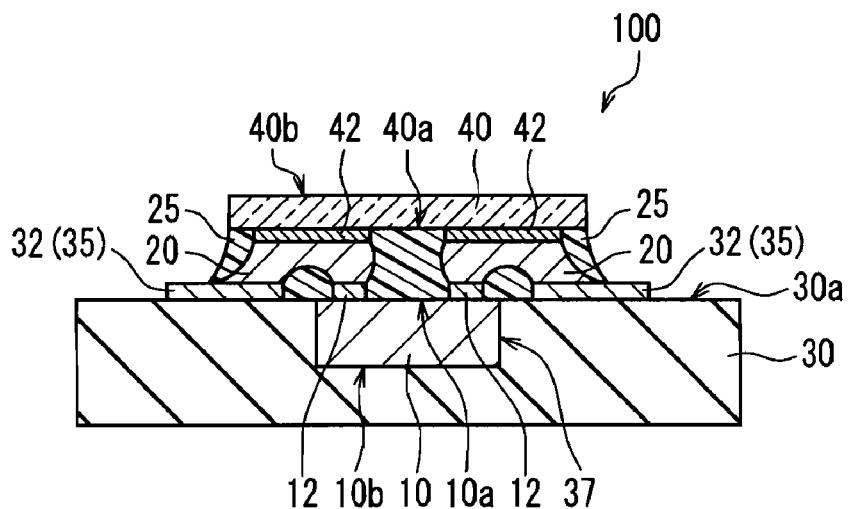
FIG. 1 is a cross-sectional view schematically showing the configuration of a mounted body according to Embodiment 1 of the present invention.

In the mounted body according to the present invention, the element electrode of the semiconductor element is connected electrically to the electrode terminal of the wiring pattern formed on the mounting board via a solder connector formed of solder particles assembled into a bridge shape. The bridge-shaped solder connector is formed by heating a solder resin paste containing the solder particles, a resin, and a convection additive so that the convection additive boils to cause convection in the resin, thus causing the solder particles to assemble into a bridge shape so as to connect the element electrode and the electrode terminal. That is, the convection additive contained in the paste boils when heated, which brings about the assembly (hereinafter also referred to as the "self-assembly") of the solder particles. Thus, the bridge-shaped solder connector is formed between the electrodes. If the solder particles also are melted at this time, the solder particles self-assemble at the element electrode and the electrode terminal, which both have high solderability, whereby the solder connector can be formed.

Preferably, the mounted body of the present invention further includes a facing substrate on which an electrode pattern is formed, and the electrode pattern is positioned above the semiconductor element with the solder connector intervening therebetween. It is preferable that the facing substrate is a light-transmitting substrate. The reason for this is that this allows the solder connector to be formed while checking the connected state thereof visually.

The facing substrate may be a flexible substrate. An opposite surface of the facing substrate also may have an electrode pattern. A shielding layer may be formed on the opposite surface of the facing substrate.

Furthermore, it is preferable that a recess is formed on a portion of the mounting board, and the rear surface of the semiconductor element is in contact with a bottom surface of the recess.

Furthermore, it is preferable that an upper surface of the mounting board is substantially coplanar with the surface of the semiconductor element. Still further, it is preferable that the semiconductor element is a thin semiconductor chip having a thickness of not less than 10 μm and not more than 100 μm. With this configuration, the overall thickness of the mounted body can be reduced.

It is preferable that the solder connector is embedded in the resin. The resin corresponds to the resin in the solder resin paste, containing a reduced amount of the solder component. It is preferable that this resin also is a light-transmitting resin. The reason for this is that this allows the solder connector to be formed while checking the connected state thereof visually.

Next, in the method according to the present invention, the facing substrate may be removed after the bridge-shaped solder connector has been formed. This allows electrical testing to be performed through the electrode pattern.

Furthermore, it is preferable that a surface of the element electrode, electrode terminal, or electrode pattern is subjected to a coating treatment for improving solderability. This makes the formation of the solder connector easier. The coating treatment for improving the solderability refers to a treatment of forming a solder plating, a gold plating, or the like with a thickness of 0.05 to 30 μm, for example.

The solder connector may have a portion extending along the electrode pattern.

The solder resin paste includes a resin, solder particles, and a convection additive that boils when the resin is heated. A thermosetting resin (e.g., epoxy resin) is used as the resin, and Pb free solder particles are used as the solder particles. As the convection additive, a solvent (e.g., an organic solvent) can be used, examples of which include isopropyl alcohol (boiling point: 82.4° C.), butyl acetate (boiling point: 125° C. to 126° C.), butyl carbitol (diethylene glycol monobutyl ether, boiling point: 201.9° C.), and ethylene glycol (boiling point: 197.6° C.). The content of the convection additive in the resin is not particularly limited, and preferably is 0.1 to 20 wt %.

Note here that the "convection" of the convection additive means convection as a kinetic form, which may be in any form as long as the motion of the boiling convection additive in the solder resin paste gives kinetic energy to the metal particles (the solder particles) dispersed in the resin, thereby promoting the movement of the metal particles. Note here that, in addition to the convection additive that boils to cause convection in itself, it is also possible to use a convection additive that generates gas (gas such as $H_2O$, $CO_2$, or $N_2$) when the resin is heated. Examples of such a convection additive include compounds containing crystal water, compounds decomposed by being heated, and foaming agents.

As the solder particles, any solder particles can be selected for use. Examples of the solder particles include those listed in Table 1 below. The materials given as examples in Table 1 can be used alone or in any appropriate combinations. As the material of the solder particles, it is preferable to use a material whose melting point is lower than the curing temperature of the thermosetting resin, because this allows, after the resin has been caused to flow to cause self-assembly of the solder particles, the resin to be heated further so as to be cured, thus achieving electric connection and encapsulation with the resin.

TABLE 1

| Composition of solder particles | Melting point (solidus) (° C.) |
| --- | --- |
| Sn—58Bi | 139 |
| Sn—37Pb | 183 |
| Sn—9Zn | 199 |
| Sn—3.0Ag—0.5Cu | 217 |
| Sn—3.5Ag | 221 |
| Sn—0.7Cu | 228 |
| 12Sn—2.0Ag—10Sb—Pb | 240 |

The melting point of the solder particles preferably is 100° C. to 300° C., more preferably 139° C. to 240° C. as shown in Table 1. When the melting point is lower than 100° C., the problem concerning the durability tends to occur. When the melting point is higher than 300° C., the selection of the resin becomes difficult.

The average particle diameter of the solder particles preferably is in the range from 1 to 30 μm, more preferably from 5 to 20 μm. When the average particle diameter is less than 1 μm, it becomes difficult to melt the solder particles due to the surface oxidation, and the formation of the electric connectors tends to take too much time. When the average particle diameter is more than 30 μm, it becomes difficult to obtain the electric connectors due to the sedimentation of the solder particles. Note here that the average particle diameter can be measured using a commercially available particle size distribution analyzer. For example, the average particle diameter can be measured using a laser diffraction particle size analyzer (LA920) available from HORIBA, Ltd., a laser diffraction particle size analyzer (SALD2100) available from Shimadzu Corporation, or the like.

Next, the resin will be described. Typical examples of the resin include: thermosetting resins such as epoxy resin, phenol resin, silicone resin, diallyl phthalate resin, furan resin, and melamine resin; thermoplastic resins such as polyester elastomer, fluororesin, polyimide resin, polyamide resin, and aramid resin; photocurable (ultraviolet curable) resins; and mixtures of at least two kinds thereof.

The mixing ratio by weight of the solder particles and the resin preferably is in the following range: conductive particles:resin=70 to 30:30 to 70, more preferably, solder particles:resin=60 to 40:40 to 60. It is preferable to use the solder particles and the resin after they have been mixed together homogenously. For example, 50 wt % of solder particles and 50 wt % of epoxy resin are mixed homogenously with a kneading machine, and a convection additive is added to the resultant mixture to prepare a paste in which the solder particles remain dispersed.

Furthermore, in preferred examples of the present invention, lead-free solder alloy particles whose melting point is 200° C. to 230° C. can be used as the solder particles, for example. When the resin is a thermosetting resin, it is preferable that the curing temperature of the resin is higher than the melting point of the solder. With this configuration, it is possible to cure the resin during the steps of forming electric connectors and forming metal bumps, thus allowing the operation process to be shortened.

After the solder connector has been formed, it is possible to wash away the solder resin paste that is not yet cured, then fill another resin (which may be the same type of resin), and cure this resin. In this case, the resin contained in the solder resin paste for forming the solder connectors is not necessarily a thermosetting resin or a photocurable resin. Furthermore, in the case where the resin to be filled later is a thermosetting resin, it is preferable that the curing temperature of the resin is lower than the melting point of the solder. The reason for this is that this prevents the solder connector from being deformed again when curing the resin.

According to the present invention, the element electrode of the semiconductor element is connected electrically to the electrode terminal of the mounting board via a solder connector formed in a self-assembled manner. Thus, it is possible to provide a novel fine pitch connection technique that is different from the wire bonding (WB) method, the flip chip bonding (FC) method, and the tape automated bonding (TAB) method.

In the following, the mechanism by which solder connectors are formed in one example of the present invention will be described with reference to the drawings.

Figure 26A:
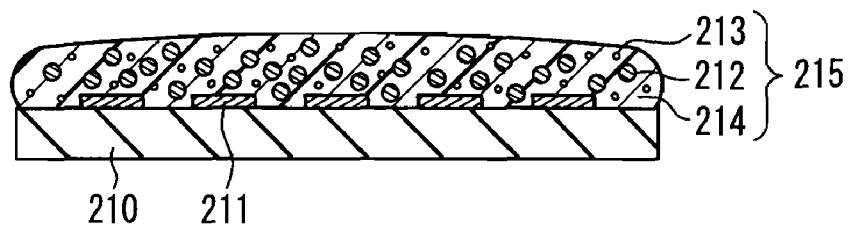
FIGS. 26A to 26C are cross-sectional views illustrating the mechanism by which solder connectors are formed in one example of the present invention.

First, as shown in FIG. 26A, a solder resin paste 215 containing metal particles (e.g., solder powder) 212, a convection additive 213, and a resin 214 is supplied onto a circuit board 210 on which a plurality of connection terminals 211 are formed. The convection additive 213 boils to cause convection when the solder resin paste 215 is heated.

Figure 26B:
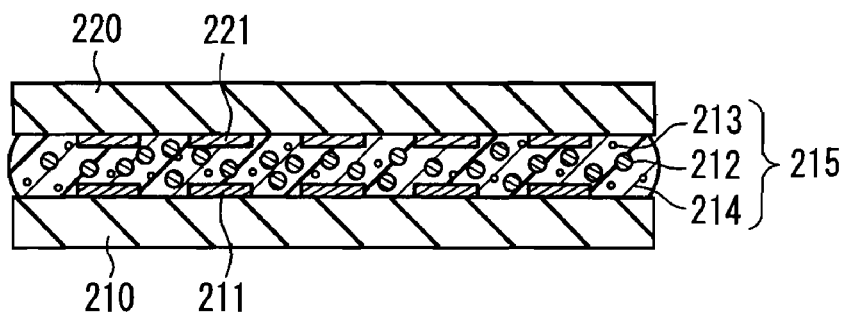

Next, as shown in FIG. 26B, a semiconductor chip 220 having a plurality of electrode terminals 221 is brought into contact with the surface of the solder resin paste 215. At this time, the semiconductor chip 220 is arranged so that the electrode terminals 221 thereof face the connection terminals 211 of the circuit board 210. In this state, the solder resin paste 215 is heated. The heating temperature of the solder resin paste 215 is set to be higher than the melting point of the metal particles 212 and the boiling point of the convection additive 213.

Figure 26C:
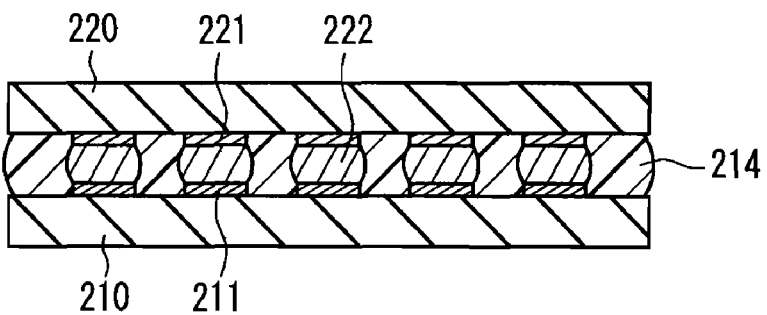

The metal particles 212 melted by the heating bind each other in the solder resin paste 215, and self-assemble between each pair of the connection terminals 211 and the electrode terminals 221, which both have high solderability, as shown in FIG. 26C. Thus, solder connectors 222 that electrically connect between the electrode terminals 221 of the semiconductor chip 220 and the connection terminals 211 of the circuit board 210 are formed. Thereafter, the resin 214 is cured or solidified, whereby the semiconductor chip 220 is fixed to the circuit board 210.

This technique is characterized in that, when the solder resin paste 215 is heated, the convection additive 213 boils to cause convection in the solder resin paste 215, thereby promoting the movement of the metal particles 212 dispersed in the solder resin paste 215. Thus, the binding of the metal particles 212 proceeds uniformly, and the solder connectors (the solder bumps) 222 can be formed in a self-assembled manner. In the above process, the resin 214 in the solder resin paste 215 is considered to serve as "sea" in which the metal particles can float and move freely. However, the binding process of the metal particles 212 completes within a very short time. Thus, even if the "sea" in which the metal particles 212 can move freely is provided, the binding proceeds only locally. Hence, the resin 214 serving as the "sea" and the promotion of the convection by the convection additive 213 are important. By using the resin 214 and the convection additive 213 in combination, the solder bumps 222 are formed in a self-assembled manner. It should be noted here that the solder bumps 222 are formed not only in a self-assembled manner but also in a self-aligned manner due to the nature of the solder bumps.

The inventors of the present invention came up with the above-described idea and further expanded the idea to finally achieve the present invention.

Hereinafter, the present invention will be described by way of embodiments with reference to the drawings. In the following description as to the drawings, elements having substantially the same functions are given the same reference numerals for the sake of simplicity in explanation. It should be noted that the present invention is by no means limited to the following embodiments.

Embodiment 1

First, a mounted body according to an embodiment of the present invention will be described with reference to FIG. 1. FIG. 1 schematically shows the cross-sectional configuration of a mounted body 100 according to the present embodiment.

The mounted body 100 according to the present embodiment includes a semiconductor element 10 having element electrodes 12 and a mounting board 30 on which wiring patterns 35 each having an electrode terminal 32 are formed. The semiconductor element 10 has a surface 10a on which the element electrodes 12 are formed and a rear surface 10b opposing the surface 10a. The rear surface 10b of the semiconductor element 10 is in contact with the mounting board 30. The element electrodes 12 of the semiconductor element 10 are connected electrically to the electrode terminals 32 of the wiring patterns 35 via solder connectors 20 formed in a self-assembled manner. It is to be noted here that the solder connectors 20 formed in a self-assembled manner are obtained by growing them on the element electrodes 12 and the electrode terminals 32 through a predetermined process, rather than by preparing solder members as shown in FIG. 1 beforehand and placing them on the element electrodes 12 and the electrode terminals 32. The details of the predetermined process will be given later.

In the present embodiment, the mounted body is configured so that it includes a substrate 40 on which electrode patterns 42 are formed. The substrate 40 is arranged on the semiconductor element 10 in such a manner that a surface 40a on which the electrode patterns 42 are formed faces the surface 10a of the semiconductor element 10 with a resin 25 intervening therebetween. The solder connectors 20 are formed inside the resin 25 while being in contact with the electrode patterns 42 of the substrate 40. Preferably, the substrate 40 is a light-transmitting substrate, which can be a glass substrate and a light-transmitting resin substrate, for example. In the present embodiment, a glass substrate is used as the substrate 40.

The mounting board 30 shown in FIG. 1 is a rigid substrate (a typical printed board), and a recess 37 is formed in a portion of the mounting board 30. The rear surface 10b of the semiconductor element 10 is in contact with the bottom surface of the recess 37. In this example, an upper surface 30a of the mounting board 30 and the surface 10a of the semiconductor element 10 are substantially coplanar (e.g., ±50 µm) with each other, and thus, upper surfaces of the element electrodes 12 and upper surfaces of the electrode terminals 32 are substantially at the same height.

Figure 2:
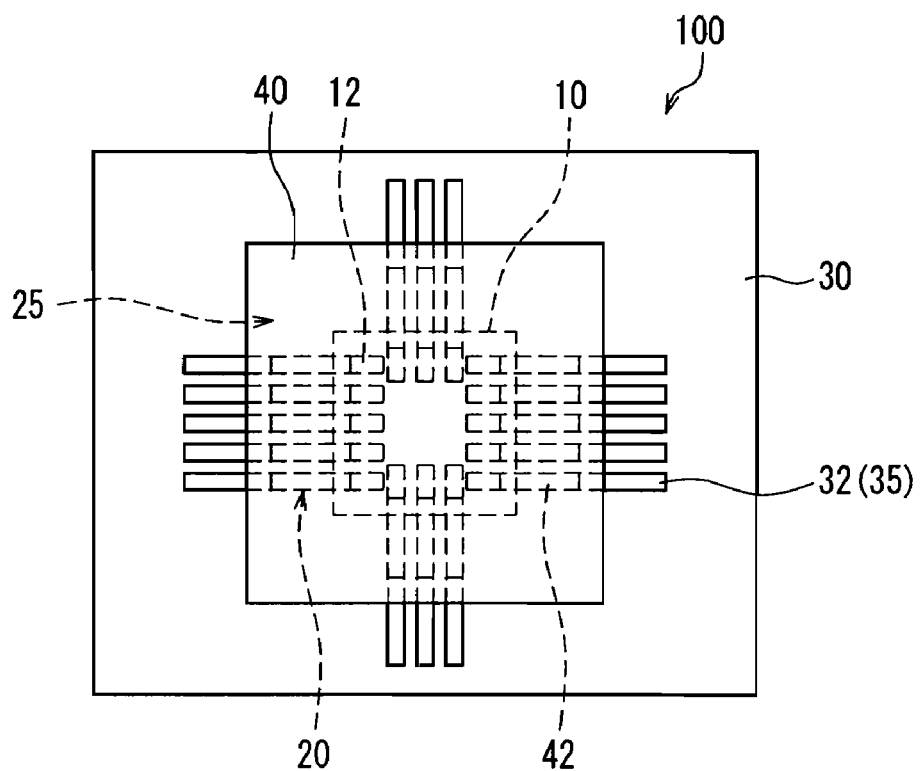
FIG. 2 is a plan view schematically showing the configuration of the mounted body according to Embodiment 1 of the present invention.

The semiconductor element 10 is a bare chip, for example. The thickness of the semiconductor element (the bare chip) 10 is 50 to 500 µm, for example. In the example shown in FIG. 1, the element electrodes 12 are arranged in a peripheral region of the chip surface 10a (peripheral arrangement). FIG. 2 shows an example of the planar configuration in which the semiconductor element 10 having the element electrodes 12 employing the peripheral arrangement are connected to the mounting board 30 with the solder connectors 20 of the present embodiment.

As shown in FIGS. 1 and 2, the element electrodes 12 of the semiconductor element 10 are connected electrically to the electrode terminals 32 via the solder connectors 20. The electrode terminal 32 is formed at one end of each of the wiring patterns 35, and preferably has a land shape. The solder connector 20 extends upward from the element electrode 12. It is formed along the electrode pattern 42 of the substrate 40 and reaches the electrode terminal 32. The resin 25 is provided around the solder connectors 20, and the adjacent solder connectors 20 are insulated from each other by the resin 25. The solder connectors 20 are formed in a bridge shape.

The solder connectors 20 are formed in a self-assembled manner. Also, they are formed in a self-aligned manner with respect to the element electrodes 12 and the electrode terminals 32. Accordingly, misalignment of the solder connectors 20 with respect to the element electrodes 12 and the electrode terminals 32 does not occur substantially, and the solder connectors 20 are formed automatically so as to correspond to the pattern of the element electrodes 12 and the electrode terminals 32. The solder connector 20 connects the element electrode 12 and the electrode terminal 32 while taking a bridge shape therebetween.

In the present embodiment, the metal (solder) used for forming the solder connectors 20 is a low melting point metal, examples of which include Sn—Ag based solders (including those to which Cu or the like has been added). The low melting point metal is not limited to the Sn—Ag based solders (including those to which Cu or the like has been added), and any low melting point metals having a melting point within the range from 100° C. to 300° C. can be used. Besides the Sn—Ag based solders, the solder particles also can be formed of, for example, Pb-free solders such as Sn—Zn based solders and Sn—Bi based solders, Pb—Sn eutectic solders, and low melting point metals such as Cu—Ag alloy. In the present embodiment, solder particles formed of an Sn—Ag—Cu material and having an average particle diameter of 20 µm were used.

As the resin 25, a thermosetting resin such as epoxy resin was used. In the present embodiment, it is preferable that the resin 25 is a light-transmitting resin (e.g., epoxy resin). The thickness of the resin 25 (that is, the distance between the chip surface 10a and the lower surface 40a of the substrate 40) is, for example, 500 µm or less, more preferably not less than 10 µm and not more than 100 µm The resin 25 surrounds at least the solder connectors 20, the element electrodes 12, and the electrode patterns 42. The wiring patterns 35 formed on the mounting board 30 and the electrode patterns 42 formed on the substrate 40 are formed of copper, for example, and they both have a thickness of 5 μm to 35 μm, for example.

The connection method according to the present embodiment is a novel connection method that is different from the above-described wire bonding method, flip chip bonding method, and TAB method, and it has various features and advantages as will be described below.

First, with the configuration of the present embodiment, the rear surface of the semiconductor element 10 can be arranged on the substrate 30. Thus, the semiconductor element 10 can be set in the recess 37 of the mounting board 30 by means of die bonding as in the case of the WB method. Furthermore, since the rear surface 10b of the semiconductor element 10 is in contact with the mounting board 30, favorable heat dissipation can be achieved.

Moreover, the semiconductor element 10 can be connected electrically to the substrate 30 with the solder connectors 20 formed along the electrode patterns 42 of the substrate 40. That is, the element electrodes 12 and the electrode terminals 32 can be connected electrically to each other collectively with the solder connectors 20. In other words, the necessity of connecting them one by one as in the WB method is eliminated. Therefore, as compared with the WB method, the time and effort required for the operation can be reduced. In addition, since the electric connection with the solder connectors 20 can be achieved in a self-assembled manner, it can be performed more easily than in the WB method as long as the conditions therefor are set properly. Moreover, a smaller equipment investment is required. Furthermore, since the solder connectors 20 are formed in a self-aligned manner, the necessity of aligning them with high accuracy at the time of electric connection is eliminated and the problem of misalignment due to the tolerance can be avoided. Thus, the configuration of the present embodiment is extremely valuable from a technological viewpoint.

In addition, the pitch can be defined by the electrode patterns 42 and the electrode terminals 32. Thus, as compared with the WB method, the configuration of the present embodiment is more suitable for fine pitch connection. Furthermore, since the solder connectors 20 are formed in a self-assembled manner and in a self-aligned manner as described above, the advantage thereof further increases in the case of such fine pitch. Moreover, as compared with the case where the WB method is employed, the mounting area can be reduced.

Moreover, with the configuration of the present embodiment, it is possible to check the positions of the element electrodes 12 of the semiconductor element 10 through the substrate 40, so that alignment can be performed more easily than in the FC method. Furthermore, when the resin 25 is a transparent resin, alignment can be performed easily even after the application of a paste made of the transparent resin. Similarly, the electrode terminals 32 on the mounting board 30 also can be aligned easily. In the case of the FC method, since the electrode-formed surface 10a of the semiconductor element 10 faces the mounting board 30, it is difficult to check the connection state of the semiconductor element 10 and the substrate 30 visually. In contrast, with the configuration of the present embodiment, not only the alignment but also the checking of the connection can be performed easily. In addition, with the configuration of the present embodiment, because the solder connectors 20 are formed in a self-aligned manner, many problems concerning the alignment are avoided inherently.

Moreover, an increase in the cost of the mounting board 30 can be suppressed as compared with the case of the FC method, because it is only required that the electrode patterns 42 of the substrate 40a be fine patterns. Furthermore, in the case where the semiconductor element is of the area array-type, a large number of terminals are concentrated in a specific region (i.e., a region of the substrate where the semiconductor element faces) in the FC method, so that, in many cases, it becomes necessary to increase the number of the layers constituting the wiring board. In contrast, with the configuration of the present embodiment, the routing of the wirings can be achieved by the electrode patterns 42 of the substrate 40, so that, as compared with the case of the FC method, the number of layers of the mounting board 30 can be reduced. This also contributes to the suppression of the increase in the cost of the mounting board 30.

With the configuration of the present embodiment, the surface of the semiconductor element 10 can be protected with the substrate 40 and the resin 25, and also the connection portion of the semiconductor element 10 and/or the connection portion of the mounting board 30 is protected. Thus, excellent connection reliability is achieved. Also, the solder connectors 20 are protected with the resin 25 and the substrate 40.

In the mounted body 100 according to the present embodiment, it is possible to use the element electrodes 12 of the semiconductor element 10, which are not provided with solder bumps, so that the cost increase can be suppressed accordingly. In particular, an advanced technique is required for the formation of the bumps on the element electrodes 12 that include a large number of pins and are arranged with a narrow pitch, resulting in an increase in cost. Thus, the fact that the formation need not be performed is highly advantageous. That is, unlike the case of the FC method, there is an advantage in that the semiconductor element 10 can be connected electrically to the mounting board 30 without forming bumps on the element electrodes 12 beforehand.

In the case of the TAB method, it is necessary to perform an inner lead bonding step and an outer lead bonding step separately. In contrast, with the configuration of the present embodiment, the semiconductor element 10 and the mounting board 30 are connected electrically to each other via the solder connectors 20, whose one end and the other end are in contact with the semiconductor element 10 and the mounting board 30, respectively, so that the electric connection can be achieved easily. Furthermore, as compared with the case where the TAB method is employed, the mounting area can be reduced.

Furthermore, in the mounted body 100 shown in FIG. 1, the rear surface 10b of the semiconductor element 10 is in contact with the bottom surface of the recess 37 formed in the mounting board 30, so that the apparent thickness of the semiconductor element 10 can be zero or can be reduced. Thus, it is possible to make the mounted body 100 thinner. Also, in the present example, the surface 10a of the semiconductor element 10 is substantially coplanar with the upper surface 30a of the mounting board 30, so that the solder connectors 20 can be formed relatively easily. However, as will be described later, even if the surface 10a of the semiconductor element 10 is not coplanar with the upper surface 30a of the mounting board 30, it is still possible to form the solder connectors 20 in a self-assembled manner and a self-aligned manner.

Furthermore, since the upper surface 40b of the substrate 40 is flat, it is possible to mount electronic components (e.g., chip components) thereon. Moreover, on the upper surface 40b of the substrate 40, wiring patterns may be formed, or alternatively, a shielding layer may be formed. The shielding layer can be a solid layer made of a conductive material, for example. As described above, the substrate 40 is not limited to a glass substrate, and other substrates (resin substrates) also can be used. Also, the substrate 40 is not limited to a light-transmitting substrate, and other substrates (e.g., a semiconductor substrate and the like) also can be used.

Next, a method for manufacturing the mounted body 100 according to the present embodiment will be described with reference to FIGS. 3A to 3E. FIGS. 3A to 3E are cross-sectional views illustrating major steps in the manufacturing method according to the present embodiment.

Figure 3A:
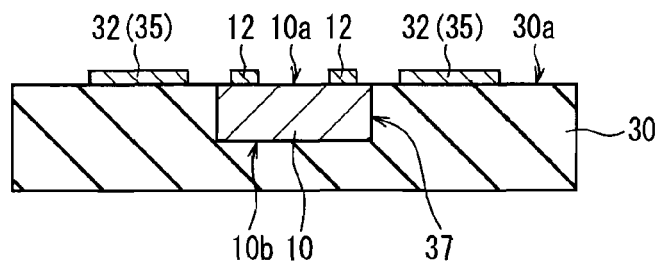
FIGS. 3A to 3E are cross-sectional views illustrating major steps in a method for manufacturing the mounted body according to Embodiment 1 of the present invention.

First, as shown in FIG. 3A, a semiconductor element (e.g., a bare chip) 10 is placed on a mounting board (e.g., a rigid printed board) 30. In this example, a recess 37 is formed in the mounting board 30, and the semiconductor element 10 is arranged so that a bottom surface 10b of the semiconductor element 10 is positioned on a bottom surface of the recess 37. On an upper surface 10a of the semiconductor element 10, element electrodes 12 are formed. On the other hand, wiring patterns 35 including electrode terminals (lands) 32 are formed on an upper surface 30a of the mounting board 30.

Figure 3B:
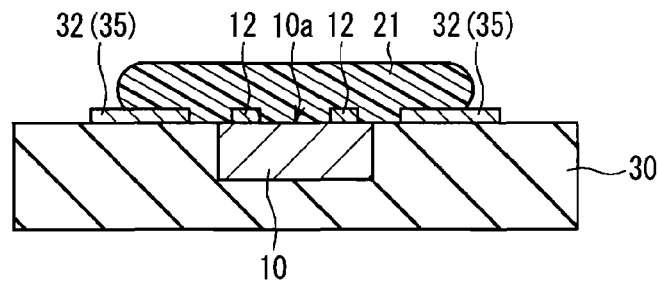

Next, as shown in FIG. 3B, a solder resin paste 21 is applied to a region including the element electrodes 12 and the electrode terminals 32. In the present embodiment, the solder resin paste 21 is applied so as to cover the entire electrode-formed surface (the entire upper surface) 10a of the semiconductor element 10 and a portion (a portion including the electrode terminals 32) of the mounting board 30.

The solder resin paste 21 includes a resin, solder particles (not shown) dispersed in the resin, and a convection additive (not shown) that boils when the resin is heated. In the present embodiment, a thermosetting resin (e.g., epoxy resin) is used as the resin, and Pb free solder particles are used as the solder particles. As the convection additive, a solvent (e.g., an organic solvent) can be used, examples of which include isopropyl alcohol, butyl acetate, butyl carbitol, and ethylene glycol. The content of the convection additive in the resin is not particularly limited, and preferably is 0.1 to 20 wt %.

Note here that the "convection" of the convection additive means convection as a kinetic form, which may in any form as long as the motion of the boiling convection additive in the resin gives kinetic energy to the metal particles (the solder particles) dispersed in the resin, thereby promoting the movement of the metal particles. Note here that, in addition to the convection additive that boils to cause convection in itself, it is also possible to use a convection additive that generates gas (gas such as $H_2O$, $CO_2$, or $N_2$) when the resin is heated. Examples of such a convection additive include compounds containing crystal water, compounds decomposed by being heated, and foaming agents.

Figure 3C:
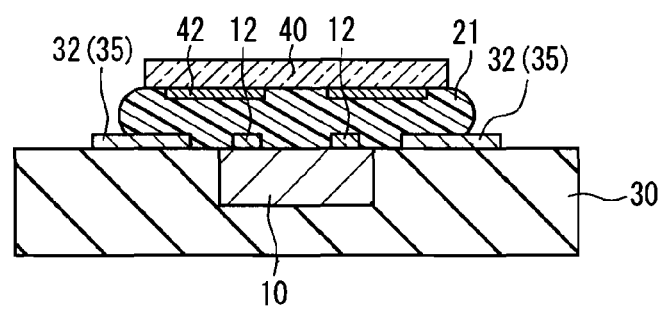

Next, as shown in FIG. 3C, a substrate 40 is placed on the applied solder resin paste 21. It is preferable that the substrate 40 is a light-transmitting substrate, and in the present embodiment, a glass substrate is used as the substrate 40. Also, it is possible to use a resin substrate or a semiconductor substrate as the substrate 40. Electrode patterns 42 are formed on a lower surface 40a of the substrate 40. A portion of each electrode pattern 42 is positioned above at least a portion of the corresponding element electrode 12, and another portion of the electrode pattern 42 is positioned above at least a portion of the corresponding electrode terminal 32.

Figure 3D:
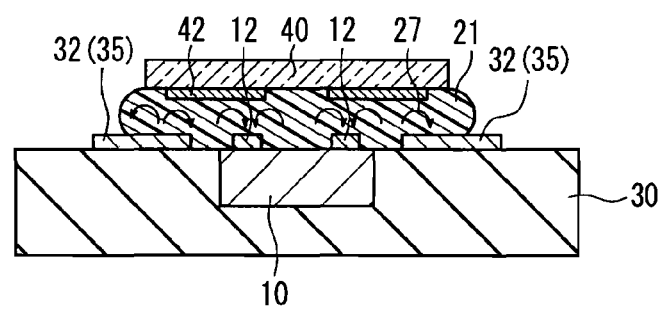

Next, as shown in FIG. 3D, the solder resin paste 21 is heated so that the convection additive (not shown) boils to cause convection 27 in the resin. In many cases, vapor bursts out from between the substrate 40 and the mounting board 30 when the convection additive is boiled. This heating process is carried out in such a manner that the temperature at which the boiling of the convection additive is caused is equal to or higher than the melting point of the solder particles. Owing to the convection 27 caused by the convection additive, the solder particles in the solder resin paste self-assemble on the element electrodes 12, the electrode patterns 42, and the electrode terminals 32. Without the convection 27 (boiling) caused by the convection additive, the growth of the solder particles cannot be promoted, so that aggregates (undissolved lumps) of the solder particles remain.

Figure 3E:
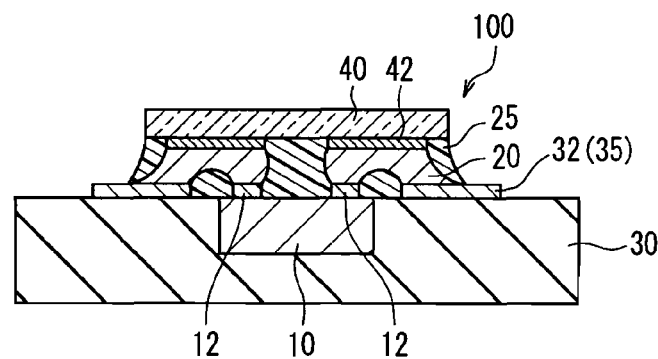

As the self-assembly of the solder particles proceeds, solder connectors 20, each connecting between the element electrode 12 and the electrode pattern 42 and between the electrode terminal 32 and the electrode pattern 42, are formed. In the present embodiment, the solder connector 20 has a portion extending along the electrode pattern 42, and the element electrode 12 and the electrode terminal 32 are connected to each other directly via the solder connector 20. The time required for forming the solder connectors 20 in FIGS. 3D and 3E is, for example, about 5 to 30 seconds (preferably, about 5 seconds), although this may vary depending on the conditions under which the solder connectors 20 are formed. It is to be noted that the process for forming the solder connectors 20 may include a preheating step of heating the solder resin paste 21 beforehand.

The solder connectors 20 are formed by the self-assembly of the solder particles in the solder resin paste 21. Thus, after the solder connectors 20 have been formed, the resin included in the solder resin paste 21 contains substantially no conductive particles, so that the adjacent solder connectors 20 are insulated from each other by the resin 25.

It is to be noted that, after the solder connectors 20 have been formed, it is possible to wash away the solder resin paste 21 that is not yet cured, then fill another resin (which may be the same type of resin), and cure this resin. In this case, the resin contained in the solder resin paste 21 for forming the solder connectors 20 is not necessarily a thermosetting resin or a photocurable resin. Furthermore, in the case where the resin to be filled later is a thermosetting resin, it is preferable that the curing temperature of the resin is lower than the melting point of the solder. The reason for this is that this prevents the solder connectors from being deformed again when curing the resin.

The following is a specific example therefor. The solder connectors 20 were formed using, as the solder resin paste 21, a mixture obtained by homogenously mixing 57 parts by weight of transparent epoxy resin (Japan Epoxy Resins Co., Ltd., trade name "Epikote 806"), 40 parts by weight of the above-described solder particles, and 3 parts by weight of a solvent composed of isopropyl alcohol. Thereafter, the solder resin paste 21 was washed away. Another thermosetting epoxy resin (NAMICS CORPORATION, trade name "8422") then was filled and cured by heating.

By curing the resin included in the solder resin paste 21 (or another resin), the mounted body 100 according to the present embodiment is obtained. In the case where another resin is filled, a resin other than thermosetting resins (e.g., a thermoplastic resin, a photocurable resin, or the like) can be used as the resin included in the solder resin paste 21.

In the case of the FC method, a resin (an underfill material) often is filled into a space between a semiconductor element and a mounting board, thus increasing the number of process steps. In contrast, according to the manufacturing method of the present embodiment, the cured resin 25 also can serve as an underfill material, so that it is possible to avoid the problem of the increase in the number of process steps.

In the present embodiment, since the light-transmitting substrate is used as the substrate 40, the connection by the solder connectors 20 can be checked through the substrate 40. Moreover, since the light-transmitting resin is used as the resin 25, the connection can be checked still more easily.

Subsequent to the state shown in FIG. 3E, the substrate 40 may be removed. When the substrate 40 is removed to expose the electrode patterns 42 or the solder connectors 20 on the upper surface of the resin 25, it becomes possible to conduct electrical testing using the conductive portions thus exposed. For example, electrical testing can be conducted by removing the substrate 40 to expose the electrode patterns 42 and bringing a terminal (e.g. a probe) of a tester into contact with the electrode patterns 42.

Embodiment 2

Figure 4:
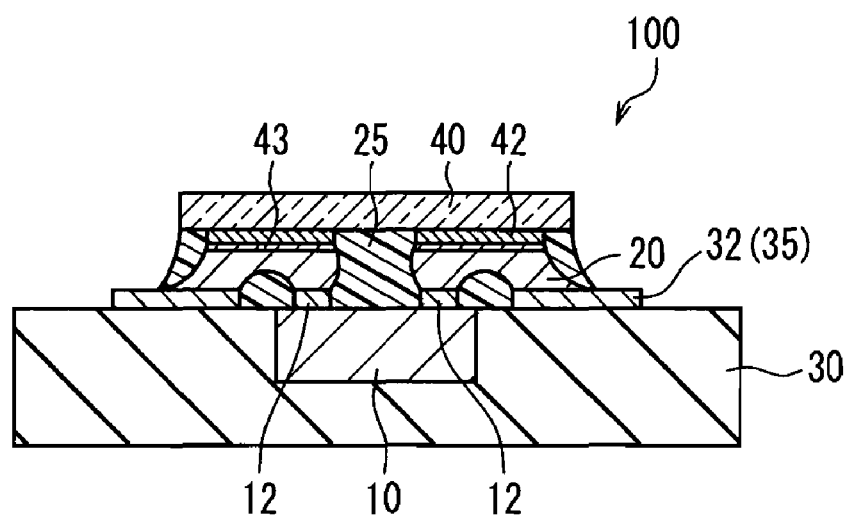
FIG. 4 is a cross-sectional view schematically showing a mounted body according to Embodiment 2 of the present invention.

In a mounted body 100 shown in FIG. 4, a layer 43 for improving solderability is formed on a surface of each electrode pattern 42 of a substrate 40. That is, in this example, the surfaces of the electrode patterns 42 are subjected to a coating treatment for improving solderability. By improving the solderability of the surfaces of the electrode patterns 42, the formation of solder connectors 20 in a self-assembled manner can be achieved easily or more stably. The coating treatment for improving the solderability can be, for example, formation of an SnBi layer as a solder plating layer.

Embodiment 3

Figure 5:
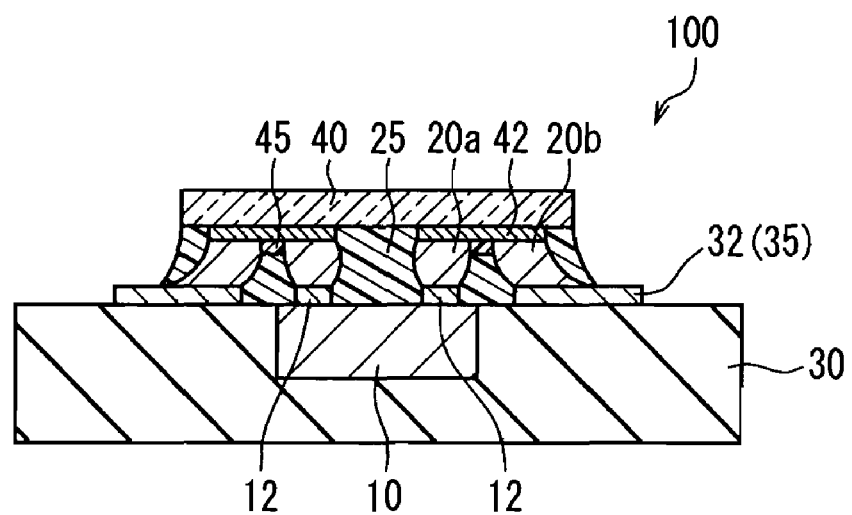
FIG. 5 is a cross-sectional view schematically showing a mounted body according to Embodiment 3 of the present invention.

In a mounted body 100 shown in FIG. 5, a mask layer 45 is formed on a portion of a surface of each electrode pattern 42, and each solder connector 20 includes a solder bump portion 20a connecting an element electrode 12 and the electrode pattern 42 and a solder bump portion 20b connecting an electrode terminal 32 and the electrode pattern 42. Even if the solder connector 20 does not connect the element electrode 12 and the electrode terminal 32 directly, it is possible to connect the element electrode 12 and the electrode terminal 32 electrically to each other via the electrode pattern 42 as in this example. The mask layer 45 is formed of a material whose solderability is lower than that of the electrode pattern 42. For example, the mask layer 45 is formed of a solder resist. When the mask layer 45 is formed in such a manner that, on the surface of the electrode pattern 42, it is present on an area between a portion corresponding to the element electrode 12 and a portion corresponding to the electrode terminal 32, the solder connector 20 is divided into two portions (20a, 20b) as shown in FIG. 5. This can bring about an advantage in that the predictability of the shape of the solder connector 20 can be improved and thus the properties (the resistance, stress, strength, etc.) of the solder connector 20 can be predicted easily.

Figure 6A:
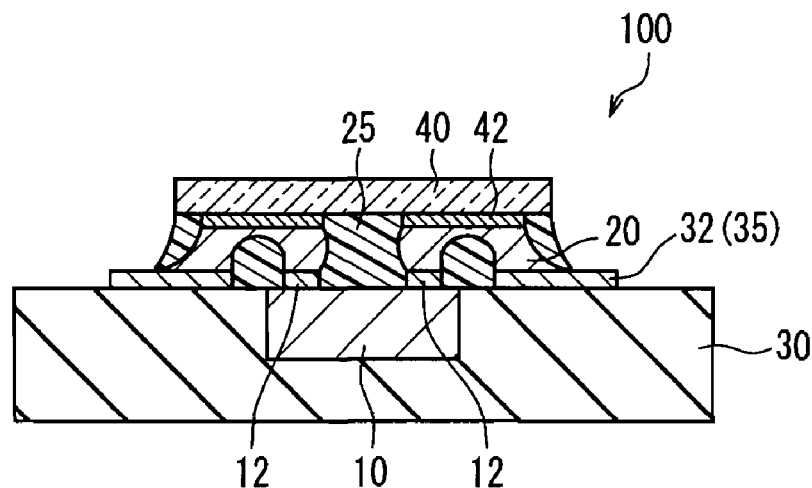
FIG. 6A is a cross-sectional view schematically showing an application example of the mounted body according to Embodiment 3 of the present invention.
Figure 6B:
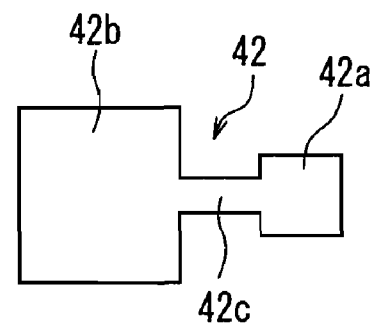
FIG. 6B is a view showing the planar configuration of an electrode pattern in this mounted body.
Figure 6C:
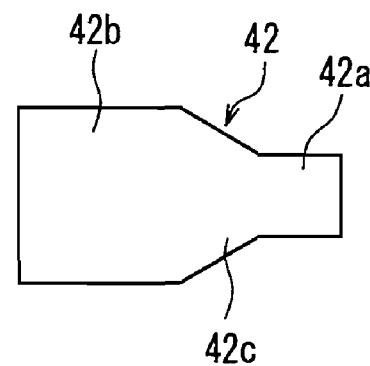
FIG. 6C is a view showing the planar configuration of another electrode pattern 42 in this mounted body.

The shape of the solder connector 20 can be changed without forming the mask layer 45. In a mounted body 100 shown in FIG. 6A, the shape of an electrode pattern 42 is devised. For example, as shown in FIG. 6B, the electrode pattern 42 is designed so that, as compared with areas of a portion 42a corresponding to an element electrode 12 and a portion 42b corresponding to an electrode terminal 32, an area of a portion 42c connecting these portions (42a, 42b) becomes smaller. With this configuration, during the formation of the solder connectors 20 by self-assembly, the solder connectors 20 are likely to be brought into contact with the portions 42a, 42b first. Also, the joint portion 42c can be formed so as to be inclined, as shown in FIG. 6C. Note here that, in accordance with the area of the element electrode 12 and the area of the electrode terminal 32, the area of the portion 42b corresponding to the electrode terminal 32 is made larger than the area of the portion 42a corresponding to the element electrode 12.

Embodiment 4

Figure 7:
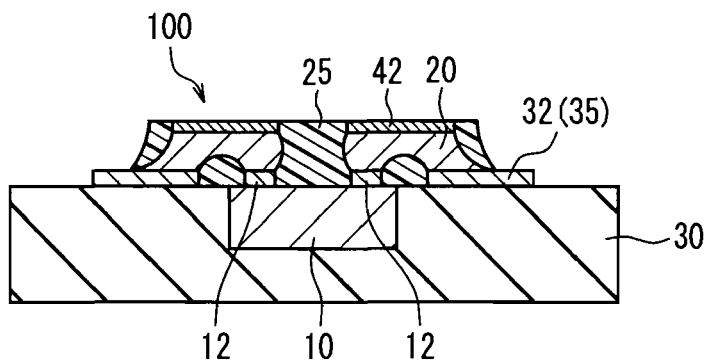
FIG. 7 is a cross-sectional view schematically showing a mounted body according to Embodiment 4 of the present invention.

In a mounted body 100 shown in FIG. 7, the substrate 40 is removed so that electrode patterns 42 are exposed on a surface. The removal of the substrate 40 can be achieved by separating the substrate 40 or grinding the substrate 40. Because the electrode patterns 42 are exposed, it becomes possible to use them as test terminals. Furthermore, a resin 25 may be removed from the mounted body 100 shown in FIG. 7, thus providing the configuration shown in FIG. 8.

Figure 9:
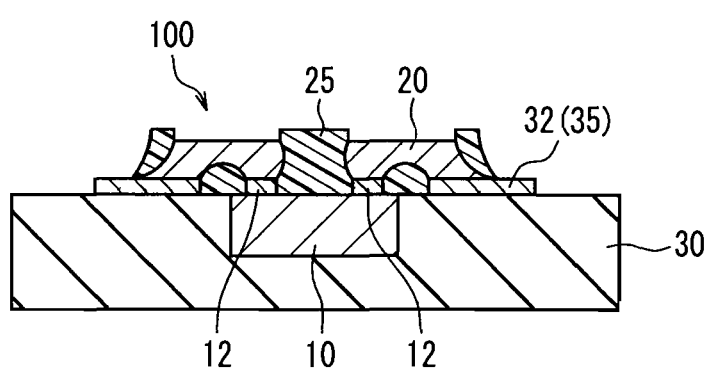
FIG. 9 is a cross-sectional view schematically showing another application example of the mounted body according to Embodiment 4 of the present invention.

Furthermore, as shown in FIG. 9, the electrode patterns 42 can be removed from the mounted body 100 shown in FIG. 7, thereby exposing solder connectors 20. The resin 25 may be removed further therefrom, thus providing the configuration shown in FIG. 10.

Embodiment 5

Figure 8:
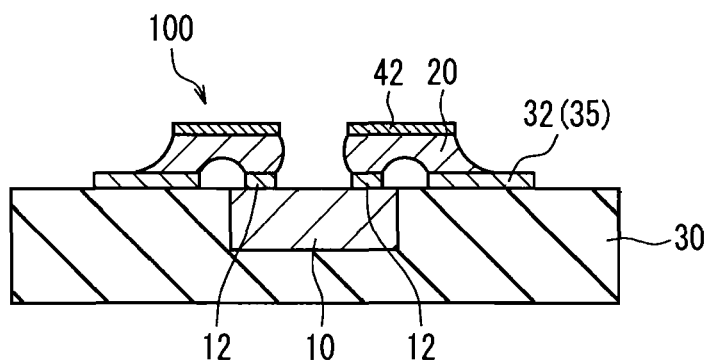
FIG. 8 is a cross-sectional view schematically showing an application example of the mounted body according to Embodiment 4 of the present invention.
Figure 10:
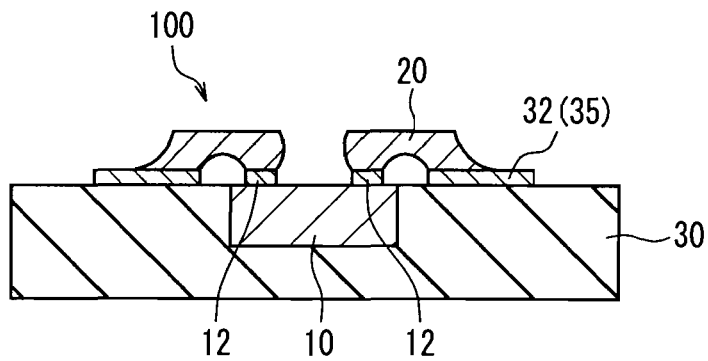
FIG. 10 is a cross-sectional view schematically showing still another application example of the mounted body according to Embodiment 4 of the present invention.
Figure 11:
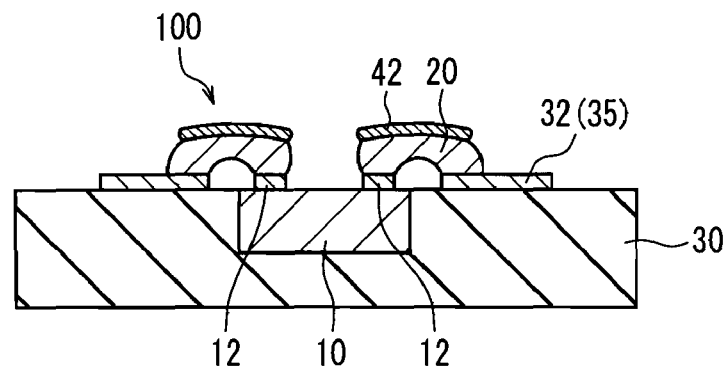
FIG. 11 is a cross-sectional view schematically showing a mounted body according to Embodiment 5 of the present invention.

In the mounted bodies 100 shown in FIGS. 8 and 10, the element electrodes 12 and the electrode terminals 32 are air-insulated from each other. However, a resin 25 may be present between the element electrodes 12 and the electrode terminals 32 to improve the insulation properties. As shown in FIG. 11, upper surfaces of solder connectors 20 may be curved slightly instead of being flat. This configuration corresponds to the configuration shown in FIG. 8 modified by being subjected to a heat treatment (e.g., a reflow treatment) for a short time so that the solder connectors 20 are melted slightly to be deformed into a shape that can relieve stress more significantly.

Embodiment 6

Figure 12:
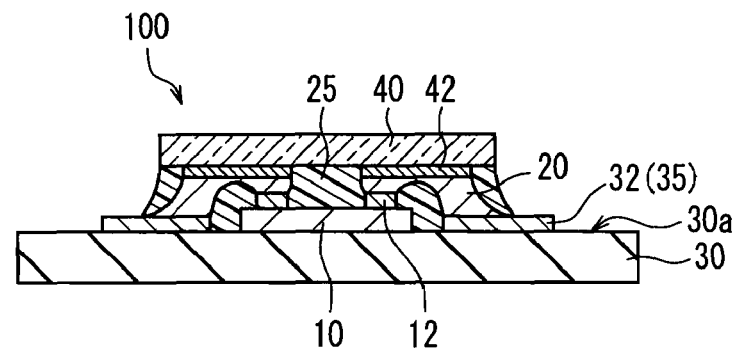
FIG. 12 is a cross-sectional view schematically showing a mounted body according to Embodiment 6 of the present invention.

In a mounted body 100 shown in FIG. 12, a semiconductor element 10 is placed on a typical mounting board 30 with its upper surface 30a being flat.

In this case, in order to reduce the difference in height between upper surfaces of element electrodes 12 and upper surfaces of electrode terminals 32 so as to allow the formation of solder connectors 20 in a self-assembled manner to be performed more easily, a thin semiconductor chip preferably is used as the semiconductor element 10. In this case, the thickness of the semiconductor element 10 is 150 µm or less, preferably about 100 µm. Note here that, even when the semiconductor element 10 has a thickness of more than 150 µm (e.g., about 200 to 450 µm), the solder connectors 20 still can be formed in a self-assembled manner without any problems.

Figure 13:
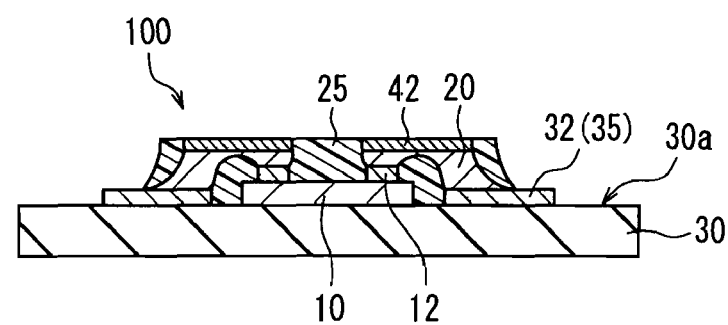
FIG. 13 is a cross-sectional view schematically showing an application example of the mounted body according to Embodiment 6 of the present invention.
Figure 14:
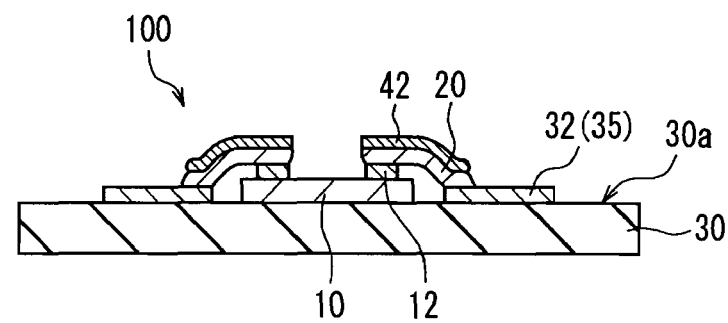
FIG. 14 is a cross-sectional view schematically showing another application example of the mounted body according to Embodiment 6 of the present invention.

When a substrate 40 is removed from the mounted body shown in FIG. 12, a mounted body 100 as shown in FIG. 13 is obtained. When the resin 25 further is removed and a reflow treatment or the like is performed so that the shape of the solder connectors 20 is modified so as to suppress the stress applied to the solder connectors 20, a mounted body 100 as shown in FIG. 14 is obtained. Note here that, in the configuration shown in FIG. 14, a resin 25 can be provided between element electrodes 12 and electrode terminals 32.

Figure 15A:
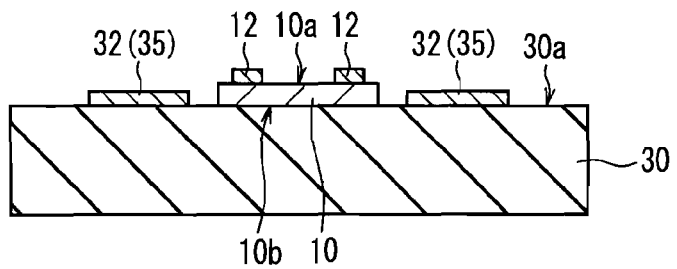
FIGS. 15A to 15E are cross-sectional views illustrating major steps in a method for manufacturing the mounted body according to Embodiment 6 of the present invention.
Figure 15B:
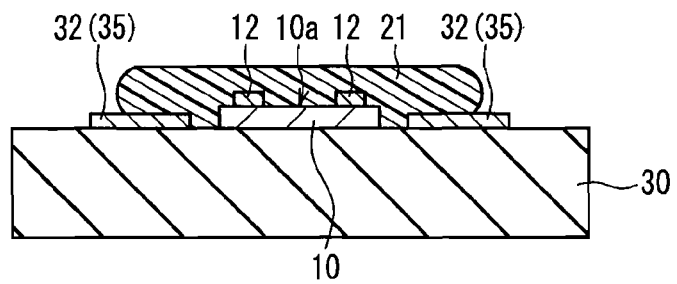
Figure 15C:
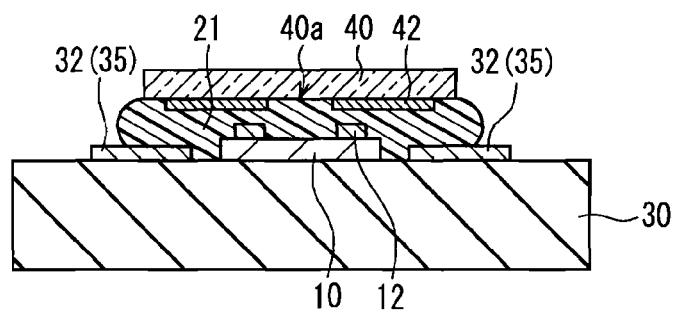
Figure 15D:
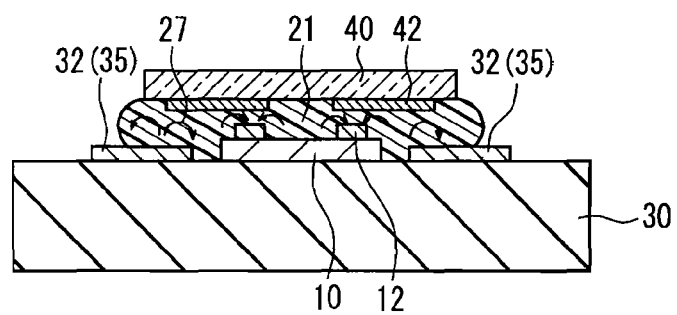
Figure 15E:
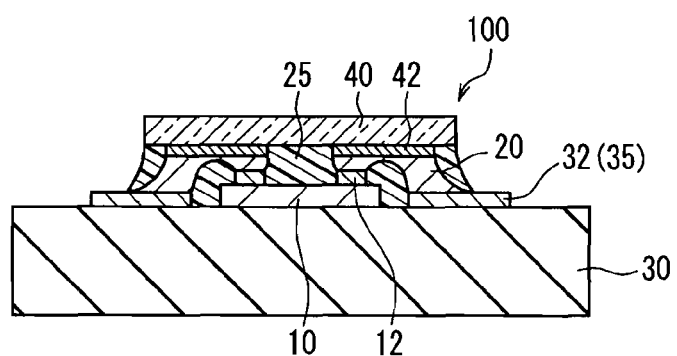

The mounted body 100 shown in FIG. 12 can be produced in the manner illustrated in FIGS. 15A to 15E, which is similar to the manner shown in FIGS. 3A to 3E. That is, a semiconductor element first is placed on a flat mounting board 30 as shown in FIG. 15A, and then a solder resin paste 21 is applied as shown in FIG. 15B. Next, a substrate 40 is placed on the solder resin paste 21 as shown in FIG. 15C, and the solder resin paste 21 is heated as shown in FIG. 15D. Then, a convection additive (not shown) boils to cause convection 27 in a resin, and the self-assembly of solder particles proceeds. Then, solder connectors 20 are formed as shown in FIG. 15E. Thus, the mounted body 100 is obtained.

Figure 16:
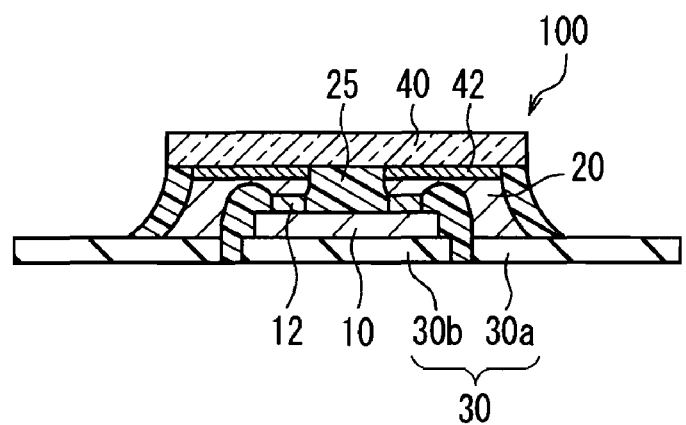
FIG. 16 is a cross-sectional view schematically showing still another application example of the mounted body according to Embodiment 6 of the present invention.
Figure 17:
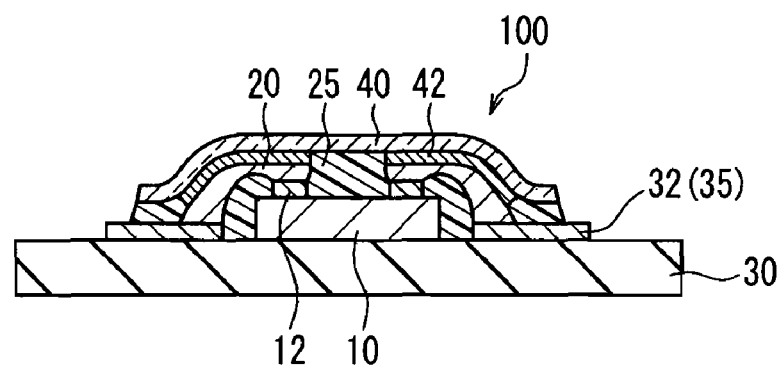
FIG. 17 is a cross-sectional view schematically showing still another application example of the mounted body according to Embodiment 6 of the present invention.

The mounting board 30 is not limited to a rigid printed board, and can be a lead frame 30 including a die pad portion 30b and a lead portion 30a as shown in FIG. 16. Furthermore, as already described above, it is also possible to use a flexible printed board as the mounting board 30. The upper surface of the substrate 40 need not be flat. For example, using a flexible substrate as the substrate 40, the mounted body may be configured so that the upper surface of the substrate 40 is curved as shown in FIG. 17.

Moreover, by using a soft substrate such as a flexible substrate as the substrate 40, it is possible to reduce stress applied to the solder connectors 20, thus stabilizing the connection portions. In addition, the gap between the electrode terminals 32 and the electrode patterns 42, which is expanded by the thickness of the semiconductor element 10, can be reduced, so that stable connection can be achieved also at the electrode terminals 32.

Figure 18:
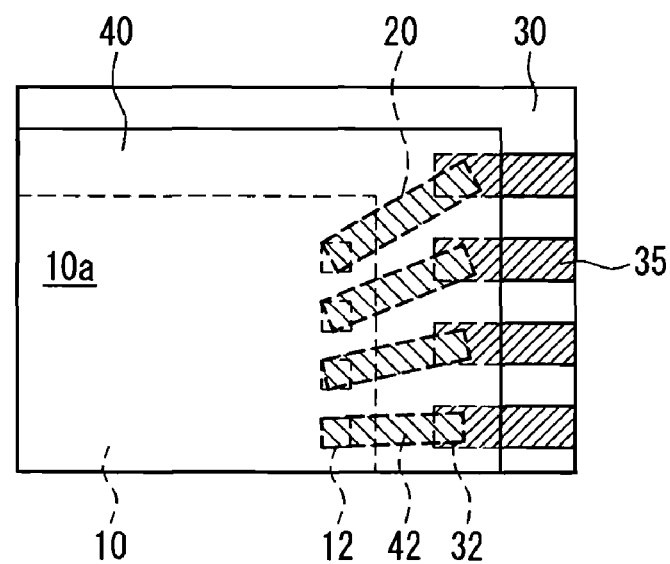
FIG. 18 is a plan view schematically showing still another application example of the mounted body according to Embodiment 6 of the present invention.

Furthermore, in the configuration example shown in FIG. 2, the element electrodes 12 and the electrode terminals 32 are led out such that the spacing (the pitch) between the element electrodes 12 is equal to that between the electrode terminals 32. However, as shown in FIG. 18, a fan-out arrangement may be employed in which the spacing (pitch) between the electrode terminals 32 is larger than that between the element electrodes 12.

Although the above-described configuration example shows the semiconductor element 10 in which the element electrodes 12 are arranged in a peripheral region, the semiconductor element 10 is not limited thereto. It is also possible to use the semiconductor element 10 in which the element electrodes 12 are arranged in an array form. Moreover, the number of terminals of the element electrodes 12 is not particularly limited, and the technique according to the embodiment of the present invention becomes more advantageous as the number of pins is larger and the pitch is narrower.

Embodiment 7

Next, the state of solder connectors 20 formed in a self-assembled manner in a mounted body 100 according to the present embodiment will be described with reference to FIGS. 19 and 20.

Figure 19:
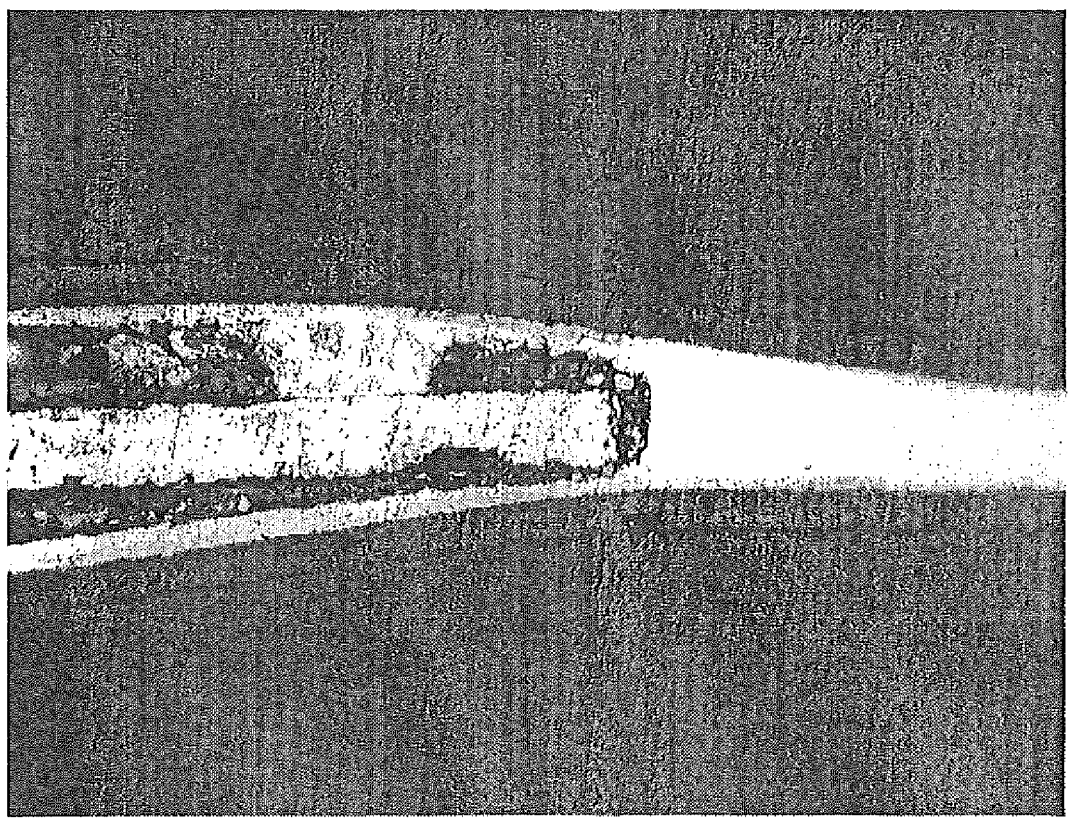
FIG. 19 is a cross-sectional micrograph for illustrating the state of solder connectors formed in a self-assembled manner in a mounted body according to Embodiment 7 of the present invention.
Figure 20:
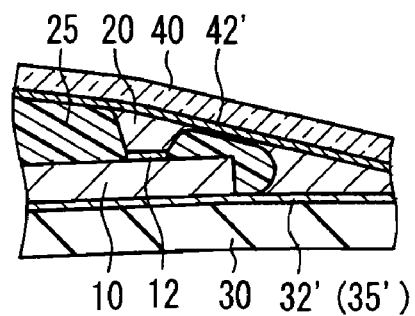
FIG. 20 is a cross-sectional view showing the configuration of the solder connectors shown in FIG. 19, which are formed in a self-assembled manner.
Figure 21A:
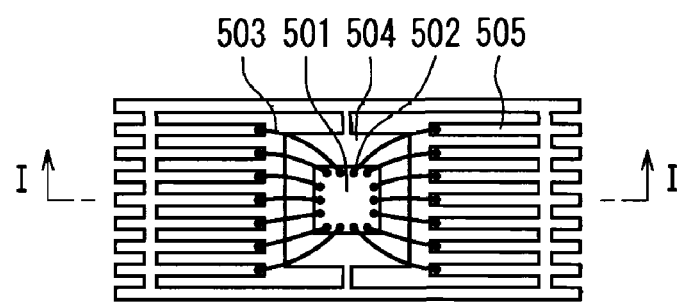
FIG. 21A is a top view showing a wire-bonded (WB) state as a prior art.
Figure 21B:
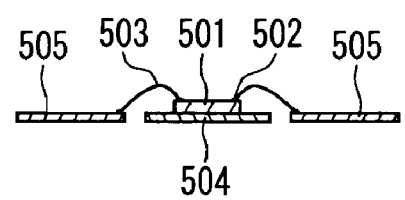
FIG. 21B is a cross-sectional view taken along a line I-I in FIG. 21A.
Figure 22:
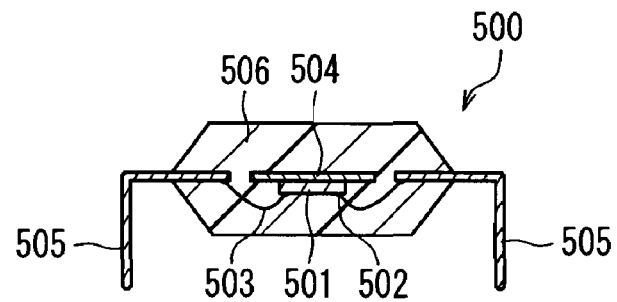
FIG. 22 is a cross-sectional view showing a conventional resin-encapsulated body (semiconductor module).
Figure 23:
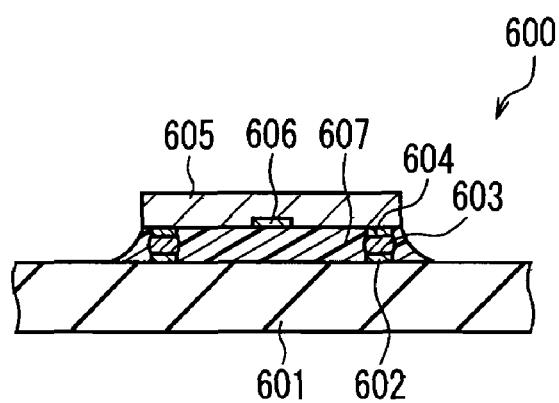
FIG. 23 is a cross-sectional view showing a semiconductor device mounted by a conventional flip chip bonding (FC) method.
Figure 24:
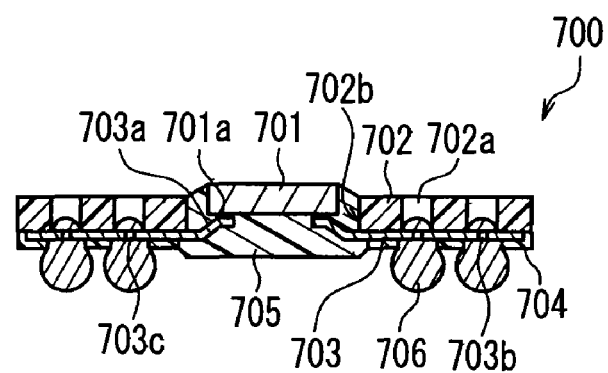
FIG. 24 is a cross-sectional view showing a semiconductor device for which a conventional tape automated bonding (TAB) method is employed.
Figure 25:
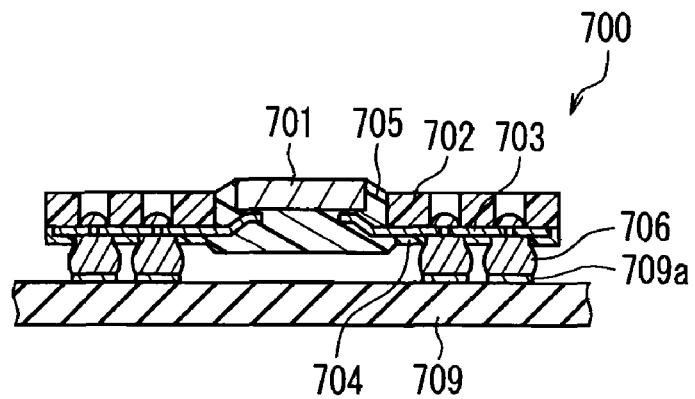
FIG. 25 is a cross-sectional view showing the configuration in which a conventional semiconductor device is mounted on a mounting board.

A cross-sectional micrograph of FIG. 19 shows the cross section of a mounted body shown in FIG. 20, which was exposed by actually grinding the mounted body, observed through a microscope. The mounted body shown in FIG. 20 was obtained by placing a semiconductor element 10 on a flexible substrate 30 provided with a solid copper layer 35' and then forming solder connectors 20 connecting element electrodes 12 and electrode terminal regions 32' in a resin 25 in a self-assembled manner through the process illustrated in FIGS. 3B to 3E.

As shown in FIG. 19, the solder connector 20 extends upward from the element electrode 12 and is formed along an electrode pattern 42' to reach the electrode terminal region 32' positioned below the electrode pattern 42'. In the cross section shown in FIG. 19, the cross-sectional configurations of the respective elements partially are unclear due to the influence of an abrasive agent filled therein. The semiconductor element 10 has a thickness of 100 µm or less (in this example, 50 µm). The substrate 30 and the substrate 40 have a thickness of 30 µm.

The present invention has been described by way of preferred embodiments. It should be noted, however, the present invention is by no means limited by the description of these preferred embodiments, and needless to say, various changes can be made to the present invention.

Although the above-described embodiments of the present invention are directed to the case where the semiconductor element 10 is a bare chip, the semiconductor element 10 is not limited to a bare chip, and can be a semiconductor package such as a chip size package (CSP), for example. Although it is preferable that the semiconductor element 10 is a memory IC chip, a logic IC chip, or a system LSI chip, the type of the semiconductor element 10 is not particularly limited.

INDUSTRIAL APPLICABILITY

According to the present invention, it is possible to provide a mounted body for which a novel fine pitch connection technique that is different from the WB method, the FC method, and the TAB method is employed and also to provide a method for manufacturing the same.

The invention claimed is:

1. A mounted body comprising:
a semiconductor element having a surface on which an element electrode is formed and a rear surface opposing said surface; and
a mounting board on which a wiring pattern having an electrode terminal is formed,
wherein the rear surface of the semiconductor element is in contact with the mounting board,
the element electrode of the semiconductor element is connected electrically to the electrode terminal of the wiring pattern formed on the mounting board via a solder connector formed of solder particles assembled into a bridge shape,
the mounted body further comprises a facing substrate on which an electrode pattern is formed, and
the electrode pattern is positioned above the semiconductor element with the solder connector intervening therebetween.

2. The mounted body according to claim 1, wherein the facing substrate is a light-transmitting substrate.

3. The mounted body according to claim 1, wherein the facing substrate is a flexible substrate.

4. The mounted body according to claim 1, wherein an opposite surface of the facing substrate also has an electrode pattern.

5. The mounted body according to claim 1, wherein a shielding layer is formed on an opposite surface of the facing substrate.

6. The mounted body according to claim 1, wherein a recess is formed on a portion of the mounting board, and
the rear surface of the semiconductor element is in contact with a bottom surface of the recess.

7. The mounted body according to claim 6, wherein an upper surface of the mounting board is substantially coplanar with the surface of the semiconductor element.

8. The mounted body according to claim 1, wherein the semiconductor element is a thin semiconductor chip having a thickness of 100 µm or less.

9. The mounted body according to claim 1, wherein the solder connector is embedded in a resin.

10. The mounted body according to claim 9, wherein an upper surface of the resin is substantially flat.

11. The mounted body according to claim 9, wherein the resin is a light-transmitting resin.

12. The mounted body according to claim 1, wherein the element electrode and the electrode terminal are connected electrically to each other via the electrode pattern.

13. A mounted body comprising:
a semiconductor element having a surface on which an element electrode is formed and a rear surface opposing said surface; and a mounting board on which a wiring pattern having an electrode terminal is formed, wherein the rear surface of the semiconductor element is in contact with the mounting board, the element electrode of the semiconductor element is connected electrically to the electrode terminal of the wiring pattern formed on the mounting board via a solder connector formed of solder particles assembled into a bridge shape, and the solder connector is formed so as to be in contact with an electrode pattern positioned at an upper surface of the solder connector.

14. The mounted body according to claim 13, wherein a recess is formed on a portion of the mounting board, and The rear surface of the semiconductor element is in contact with a bottom surface of the recess.

15. The mounted body according to claim 14, wherein an upper surface of the mounting board is substantially coplanar with the surface of the semiconductor element.

16. The mounted body according to claim 13, wherein the semiconductor element is a thin semiconductor chip having a thickness of 100 µm or less.

17. The mounted body according to claim 13, wherein the solder connector is embedded in a resin.

18. The mounted body according to claim 17, wherein an upper surface of the resin is substantially flat.

19. The mounted body according to claim 17, wherein the resin is a light-transmitting resin.

* * * * *